(12) United States Patent
Shah et al.

(10) Patent No.: US 9,324,809 B2
(45) Date of Patent: *Apr. 26, 2016

(54) METHOD AND SYSTEM FOR INTERLEAVED BOOST CONVERTER WITH CO-PACKAGED GALLIUM NITRIDE POWER DEVICES

(71) Applicant: AVOGY, INC., San Jose, CA (US)

(72) Inventors: Hemal N. Shah, San Mateo, CA (US); Donald R. Disney, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/083,217

(22) Filed: Nov. 18, 2013

(65) Prior Publication Data

US 2015/0137134 A1     May 21, 2015

(51) Int. Cl.
*H01L 29/15*     (2006.01)
*H01L 31/0256*   (2006.01)
(Continued)

(52) U.S. Cl.
CPC ............ *H01L 29/2003* (2013.01); *H01L 23/36* (2013.01); *H01L 24/36* (2013.01);
(Continued)

(58) Field of Classification Search
CPC ............... H01L 21/02458; H01L 21/0254; H01L 33/007; H01L 29/2003; H01L 33/32; H01L 2924/01079; H01L 2924/01078; H01L 2924/14; H01L 2924/01029; H01L 2924/01013; H01L 2224/48091; H01L 33/62; H01L 33/486; H01L 29/452; H01L 21/28578
USPC ............... 257/678, 690, 697, 76, E21.449, 257/E23.024, E23.033, E23.031, E23.068, 257/E23.141, E21.509, E23.086, 784, 706, 257/734, 723, 745, E33.056; 438/106–127, 438/617, FOR. 134, 25–26
See application file for complete search history.

(56) References Cited

U.S. PATENT DOCUMENTS

| | | | |
|---|---|---|---|
| 4,805,003 A | 2/1989 | Holm et al. | |
| 6,870,254 B1 * | 3/2005 | Estacio ............. | H01L 23/49562 257/666 |

(Continued)

FOREIGN PATENT DOCUMENTS

| | | |
|---|---|---|
| CN | 104659025 A1 | 5/2015 |
| WO | 99/13403 A1 | 3/1999 |
| WO | 2011/013500 A1 | 2/2011 |

OTHER PUBLICATIONS

Non-Final Office Action for U.S. Appl. No. 13/198,666 mailed on Oct. 4, 2013, 17 pages.

(Continued)

*Primary Examiner* — Thao X Le
*Assistant Examiner* — Nduka Ojeh
(74) *Attorney, Agent, or Firm* — Kilpatrick Townsend & Stockton LLP (57) ABSTRACT

An electronic package includes a leadframe and a plurality of pins. The electronic package also includes a first gallium nitride (GaN) transistor comprising a source, gate, and drain and a second GaN transistor comprising a source, gate, and drain. The source of the first GaN transistor is electrically connected to the leadframe and the drain of the second GaN transistor is electrically connected to the leadframe. The electronic package further includes a first GaN diode comprising an anode and cathode and a second GaN diode comprising an anode and cathode. The anode of the first GaN diode is electrically connected to the leadframe and the anode of the second GaN diode is electrically connected to the leadframe.

10 Claims, 8 Drawing Sheets

(51) Int. Cl.
*H01L 29/20* (2006.01)
*H01L 23/00* (2006.01)
*H01L 23/36* (2006.01)

(52) U.S. Cl.
CPC .............. *H01L 24/40* (2013.01); *H01L 24/89* (2013.01); *H01L 24/37* (2013.01); *H01L 24/45* (2013.01); *H01L 2224/05624* (2013.01); *H01L 2224/05647* (2013.01); *H01L 2224/0603* (2013.01); *H01L 2224/37147* (2013.01); *H01L 2224/40245* (2013.01); *H01L 2224/45014* (2013.01); *H01L 2224/45015* (2013.01); *H01L 2224/45124* (2013.01); *H01L 2224/48091* (2013.01); *H01L 2224/48247* (2013.01); *H01L 2224/48724* (2013.01); *H01L 2224/48747* (2013.01); *H01L 2224/49111* (2013.01); *H01L 2924/01322* (2013.01); *H01L 2924/1033* (2013.01); *H01L 2924/12032* (2013.01); *H01L 2924/13091* (2013.01)

(56) References Cited

U.S. PATENT DOCUMENTS

| | | | |
|---|---|---|---|
| 6,912,537 | B2 | 6/2005 | Selkirk et al. |
| 6,979,909 | B2* | 12/2005 | Shinohara ........... H01L 23/4334 257/706 |
| 7,031,971 | B1 | 4/2006 | Taillefer |
| 7,109,100 | B2 | 9/2006 | Nakamura |
| 7,139,892 | B2 | 11/2006 | Peinado et al. |
| 7,355,223 | B2 | 4/2008 | Harris et al. |
| 7,592,647 | B2 | 9/2009 | Nakata et al. |
| 7,653,832 | B2 | 1/2010 | Faibish et al. |
| 7,711,923 | B2 | 5/2010 | Rogers et al. |
| 7,802,063 | B1 | 9/2010 | Chatterjee et al. |
| 7,863,649 | B2 | 1/2011 | Hikita et al. |
| 7,873,619 | B1 | 1/2011 | Faibish et al. |
| 7,873,782 | B2 | 1/2011 | Terry et al. |
| 7,875,538 | B2 | 1/2011 | Matsuda |
| 7,991,946 | B2 | 8/2011 | Lee et al. |
| 8,032,637 | B2 | 10/2011 | Prince, Jr. et al. |
| 8,041,907 | B1 | 10/2011 | Wu et al. |
| 8,041,924 | B2 | 10/2011 | Strange et al. |
| 8,466,017 | B2 | 6/2013 | Sheridan et al. |
| 8,502,234 | B2 | 8/2013 | Kizilyalli et al. |
| 8,698,164 | B2 | 4/2014 | Disney et al. |
| 8,716,716 | B2 | 5/2014 | Nie et al. |
| 8,788,788 | B2 | 7/2014 | Colgrove et al. |
| 8,872,970 | B2 | 10/2014 | Panje et al. |
| 8,916,871 | B2 | 12/2014 | Alvarez et al. |
| 8,937,317 | B2 | 1/2015 | Disney et al. |
| 8,969,912 | B2 | 3/2015 | Kizilyalli et al. |
| 2001/0032999 | A1 | 10/2001 | Yoshida |
| 2002/0003245 | A1 | 1/2002 | Kato et al. |
| 2002/0087544 | A1 | 7/2002 | Selkirk et al. |
| 2004/0124435 | A1 | 7/2004 | D'Evelyn et al. |
| 2006/0145283 | A1 | 7/2006 | Zhu et al. |
| 2006/0151868 | A1* | 7/2006 | Zhu .................... H01L 23/3107 257/690 |
| 2007/0029573 | A1 | 2/2007 | Cheng et al. |
| 2007/0090481 | A1 | 4/2007 | Richieri |
| 2007/0096167 | A1 | 5/2007 | Francis et al. |
| 2008/0180871 | A1* | 7/2008 | Hebert .................... H01L 24/49 361/106 |
| 2008/0265326 | A1 | 10/2008 | Hebert |
| 2009/0267078 | A1 | 10/2009 | Mishra et al. |
| 2009/0269896 | A1 | 10/2009 | Chen et al. |
| 2010/0025693 | A1 | 2/2010 | Malhan et al. |
| 2010/0025730 | A1 | 2/2010 | Heikman et al. |
| 2010/0124814 | A1 | 5/2010 | Arena |
| 2010/0148186 | A1 | 6/2010 | Sheridan et al. |
| 2010/0153620 | A1 | 6/2010 | McKean et al. |
| 2010/0327318 | A1 | 12/2010 | Okamoto et al. |
| 2011/0012169 | A1 | 1/2011 | Takizawa et al. |
| 2011/0074007 | A1* | 3/2011 | Lopez ............... H01L 23/49537 257/692 |
| 2011/0084284 | A1 | 4/2011 | Zhang et al. |
| 2011/0167221 | A1 | 7/2011 | Pangal et al. |
| 2011/0204381 | A1 | 8/2011 | Okada et al. |
| 2011/0210377 | A1 | 9/2011 | Haeberlen et al. |
| 2012/0012968 | A1 | 1/2012 | Konsek |
| 2012/0037918 | A1 | 2/2012 | Miyazaki et al. |
| 2012/0049372 | A1 | 3/2012 | Hamerski |
| 2012/0068186 | A1 | 3/2012 | Otremba |
| 2012/0223322 | A1 | 9/2012 | Lin et al. |
| 2012/0223337 | A1 | 9/2012 | Terano et al. |
| 2013/0032811 | A1 | 2/2013 | Kizilyalli et al. |
| 2013/0032812 | A1 | 2/2013 | Kizilyalli et al. |
| 2013/0032814 | A1 | 2/2013 | Bour et al. |
| 2013/0087879 | A1 | 4/2013 | Edwards et al. |
| 2013/0107118 | A1 | 5/2013 | Panje et al. |
| 2013/0112985 | A1 | 5/2013 | Kizilyalli et al. |
| 2013/0126885 | A1 | 5/2013 | Disney et al. |
| 2013/0153963 | A1 | 6/2013 | Shealy et al. |
| 2013/0161633 | A1 | 6/2013 | Nie et al. |
| 2014/0021479 | A1 | 1/2014 | Hyland et al. |
| 2014/0070226 | A1 | 3/2014 | Alvarez et al. |
| 2014/0131721 | A1 | 5/2014 | Nie et al. |
| 2014/0183543 | A1 | 7/2014 | Disney et al. |
| 2014/0191241 | A1 | 7/2014 | Edwards et al. |
| 2014/0346522 | A1 | 11/2014 | Disney et al. |
| 2015/0206768 | A1 | 7/2015 | Disney et al. |

OTHER PUBLICATIONS

Non-Final Office Action for U.S. Appl. No. 13/611,467 mailed on Oct. 10, 2013, 23 pages.
Non-Final Office Action for U.S. Appl. No. 13/552,365 mailed on Nov. 27, 2013, 17 pages.
Final Office Action for U.S. Appl. No. 13/198,666 mailed on Feb. 26, 2014, 23 pages.
Final Office Action for U.S. Appl. No. 13/611,467 mailed on Apr. 11, 2014, 23 pages.
Final Office Action for U.S. Appl. No. 13/552,365 mailed on Apr. 25, 2014, 12 pages.
Non-Final Office Action for U.S. Appl. No. 13/198,666 mailed on Jun. 9, 2014, 23 pages.
Final Office Action for U.S. Appl. No. 13/611,467 mailed on Jun. 19, 2014, 15 pages.
Notice of Allowance for U.S. Appl. No. 13/730,619 mailed on Sep. 15, 2014, 8 pages.
Non-Final Office Action, dated on May 5, 2015, for U.S. Appl. No. 14/562,381, filed Dec. 5, 2014, 10 pages.
Non-Final Office Action, dated on Apr. 23, 2015, for U.S. Appl. No. 13/901,546, filed May 23, 2013, 14 pages.
International Search Report and Written Opinion, mailed on Feb. 11, 2013, for International Application No. PCT/US2012/066669 8 pages.
International Search Report and Written Opinion, mailed on Oct. 10, 2012, for International Application No. PCT/US2012/050490 9 pages.
U.S. Appl. No. 13/901,546, Advisory Action, Nov. 13, 2015, 2 pages.
U.S. Appl. No. 13/901,546, Final Office Action, Aug. 10, 2015, 13 pages.
U.S. Appl. No. 14/562,381, Final Office Action, Sep. 3, 2015, 13 pages.
U.S. Appl. No. 13/901,546, "Notice of Allowance", Dec. 21, 2015, 7 pages.
U.S. Appl. No. 14/562,381, "Non-Final Office Action", Feb. 1, 2016, 12 pages.

* cited by examiner

METHOD AND SYSTEM FOR INTERLEAVED BOOST CONVERTER WITH CO-PACKAGED GALLIUM NITRIDE POWER DEVICES

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to co-packaging gallium nitride (GaN) electronics. Merely by way of example, the invention has been applied to methods and systems for manufacturing GaN power devices. In a particular embodiment, an interleaved boost converter utilizing co-packaged GaN power devices is provided. The methods and techniques can be applied to a variety of semiconductor devices, such as metal-oxide-semiconductor field-effect transistors (MOSFETs), bipolar transistors (BJTs, HBTs), diodes, and the like.

According to an embodiment of the present invention, an electronic package is provided. The electronic package includes a leadframe and a plurality of pins. The electronic package also includes a first gallium nitride (GaN) transistor comprising a source, gate, and drain. The source of the first GaN transistor is electrically connected to the leadframe. The electronic package also includes a second GaN transistor comprising a source, gate, and drain. The drain of the second GaN transistor is electrically connected to the leadframe. The electronic package further includes a first GaN diode comprising an anode and cathode. The anode of the first GaN diode is electrically connected to the leadframe. The electronic package further includes a second GaN diode comprising an anode and cathode. The anode of the second GaN diode is electrically connected to the leadframe.

According to another embodiment of the present invention, a method of fabricating an electronic package is provided. The method includes providing a package comprising a leadframe and a plurality of pins, providing a set of gallium nitride (GaN) transistors, each comprising a drain contact, a source contact, and a gate contact, and joining the drain contact of a first GaN transistor of the set of GaN transistors and the drain contact of a second GaN transistor of the set of GaN transistors to the leadframe. The method also includes providing a set of GaN diodes, each comprising an anode contact and a cathode contact and joining the anode contact of the first GaN diode and the anode contact of the second GaN diode to the leadframe.

Numerous benefits are achieved by way of the present invention over conventional techniques. For example, embodiments of the present invention reduce the physical electronic package size of the power circuit when using GaN devices (e.g., a transistor, a diode, or the like) while still delivering high voltage and current ratings, which would, using conventional techniques, result in large, heavy packages. Capacitance may also be reduced as a result of smaller package sizes of GaN circuits, thereby reducing electromagnetic interference (EMI). Since GaN devices may be co-packaged closely together, parasitic inductance, resistance, and capacitance associated with interconnections between devices may be substantially reduced.

Additionally, GaN circuits are capable of operating at much higher frequencies than conventional silicon circuits without sacrificing power performance. Power electronics using conventional techniques may increase power loss and EMI when operated at higher frequencies. However, GaN power electronics reduce power loss and EMI, even at high frequencies.

Furthermore, co-packaged GaN power devices may provide more cost-effective solutions. For example, the GaN power electronics described herein co-package two set of GaN power devices (e.g., a pair of transistors and diodes), such that only one electronic package and one heat sink is utilized. Co-packaging GaN devices also results in easier assembly of the electronic packages, less board space, and therefore less cost for the board and its enclosure. These and other embodiments of the present invention, along with many of its advantages and features, are described in more detail in conjunction with the text below and attached figures.

DETAILED DESCRIPTION OF SPECIFIC EMBODIMENTS

The present invention relates generally to electronic devices. More specifically, the present invention relates to co-packaging GaN electronics. Merely by way of example, the invention has been applied to methods and systems for manufacturing GaN power devices. The methods and techniques can be applied to a variety of vertical semiconductor devices, such as junction field-effect transistors (JFETs), metal-oxide-semiconductor field-effect transistors (MOSFETs), bipolar transistors (BJTs, HBTs), diodes, and the like.

GaN-based electronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

The superior properties of GaN can give rise to improved semiconductor devices, especially power semiconductor devices. Prior art GaN power devices are typically lateral devices that utilize only the top side of a semiconductor wafer, locating electrical contacts such that electricity travels laterally along the semiconductor surface. This tends to consume a large surface area on the semiconductor. Vertical semiconductor devices, on the other hand, utilize a smaller surface area to achieve the same performance (i.e., forward current conduction capability) as lateral devices. Vertical semiconductor devices have electrical contacts on both the top surface of the semiconductor and on the bottom surface, or backside, such that electricity flows vertically between the electrical contacts. Vertical power devices are vertical semiconductor devices that can be utilized in high power and/or high voltage applications, such as power electronics.

A boost mode converter (also referred to as a step-up converter) is a power converter with an output voltage greater than its input voltage. Boost mode converters utilize at least two semiconductor switches (a diode and a transistor) and at least one energy storage element, a capacitor, inductor, or the two in combination. In a conventional boost mode converter using traditional power semiconductor devices, such as silicon power devices, the transistors and diodes are typically devices that are packaged separately. The boost mode converter described herein comprises GaN power transistors and GaN power diodes that both utilize a vertical architecture and are co-packaged together into a single electronic package. For a given voltage and current rating, GaN power devices may be significantly smaller than their silicon counterparts. For example, a 600V, 5 A GaN power device may have a surface area that is 100 times smaller than a 600V, 5 A silicon power device. Vertical GaN power devices may also be operated at much higher frequencies (e.g., 500 kHz-20 MHz) compared to vertical silicon power devices (e.g., up to 1 MHz) without a substantial increase in power loss. Embodiments of the present invention enable operation at high frequencies with greatly reduced noise, EMI, and power loss, by reducing or minimizing the parasitic inductance, resistance, and capacitance of the boost mode converter.

The GaN transistors and GaN diodes are co-packaged in an embodiment into a single electronic package to provide a total solution that is much smaller than what can be achieved by packaging the transistors and diodes separately, or co-packaging silicon transistors and silicon diodes. The capacitance of a power semiconductor device generally scales with area, so GaN power devices generally have much lower capacitance than similarly rated silicon power devices. Package-related capacitance also scales with size, so the electronic package-related capacitance is also greatly reduced as a result of smaller package sizes associated with GaN circuits. These lower capacitances provide greatly reduced switching losses for GaN power devices in comparison to similarly rated silicon power devices. Due to their small size, GaN devices may be co-packaged closely together, and parasitic inductance, resistance, and capacitance associated with interconnections between devices may be substantially reduced as the interconnection (e.g., current path) between these devices is made through a highly-conductive leadframe. Reducing these parasitic inductances greatly reduces electromagnetic interference (EMI), especially at high switching frequencies, and also reduces the over-voltage stress on the power semiconductor devices and other power electronic circuit elements. As a result, power electronics according to embodiments of the invention provide benefits and advantages such as faster switching, lower power loss, and less EMI than achieved with conventional approaches.

Figure 1:
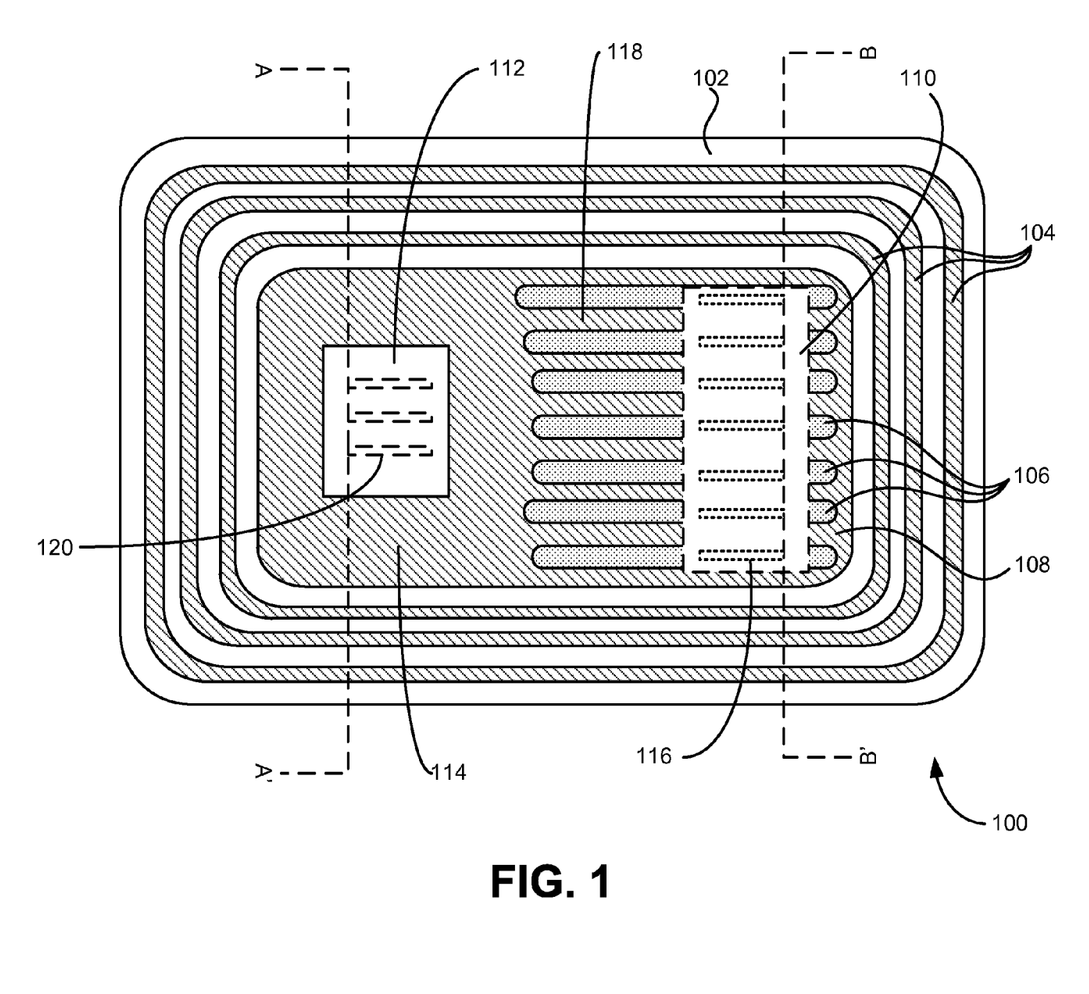
FIG. 1 illustrates a top view of a GaN power device according to an embodiment of the present invention.

FIG. 1 illustrates a top-view of a GaN power transistor 100 including guard rings according to an embodiment of the present invention. Processes for the fabrication of vertical power transistor 100 are described in commonly assigned U.S. Patent Application Publication No. 2013/0032811, published on Feb. 7, 2013, entitled "Method and System For a GaN Vertical JFET Utilizing a Regrown Gate, U.S. Patent Application Publication No. 2013/0032812, published on Feb. 7, 2013, entitled "Method and System For a GaN Vertical JFET Utilizing a Regrown Channel, U.S. patent application Ser. No. 13/675,826, filed on Nov. 13, 2012, entitled "Later GaN JFET with Vertical Drift Region, and U.S. patent application Ser. No. 13/735,897, filed on Jan. 7, 2013, entitled "Gallium Nitride Vertical JFET With Hexagonal Cell Structure," the disclosures of which are hereby incorporated by reference.

GaN power transistor 100 includes a first gallium nitride layer 102 that is coupled to a substrate (not shown). In some embodiments, the substrate is a gallium nitride substrate. In some embodiments, first gallium nitride layer 102 can include an epitaxially grown gallium nitride layer, e.g., GaN that has n-type conductivity. First gallium nitride layer 102 can serve as a drift region and therefore can be a relatively low-doped material. For example, first gallium nitride layer 102 can have an n-conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region. In some embodiments, n-type dopants can include silicon, oxygen, selenium, tellurium, or the like.

The thickness of first gallium nitride layer 102 can also vary substantially, depending on the desired functionality. As discussed above, homoepitaxial growth can enable first gallium nitride layer 102 to be grown far thicker than heteroepitaxial GaN layers formed on non-GaN substrates. Thicknesses can vary between 0.5 μm and 100 μm, for example. In some embodiments thicknesses are greater than 5 μm. Resulting parallel plane breakdown voltages for GaN power transistor 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

A second gallium nitride layer 108 can be epitaxially grown over first gallium nitride layer 102. Second gallium nitride layer 108, from which edge termination structures 104 are eventually formed, can have a conductivity type different than first gallium nitride layer 102. For instance, if first gallium nitride layer 102 is formed from an n-type GaN material, second gallium nitride layer 108 may be formed from a p-type GaN material, and vice versa. In some embodiments, second gallium nitride layer 108 is used to form the edge termination structures and is a continuous regrowth over portions of first gallium nitride layer 102 with other portions of the structure, such as regions of other semiconductor devices, characterized by reduced or no growth as a result of the presence of a regrowth mask (not shown). One of ordinary skill in the art would recognize many variations, modifications, and alternatives.

The thickness of second gallium nitride layer 108 can vary, depending on the process used to form the layer and the device design. In some embodiments, the thickness of second gallium nitride layer 108 is between 0.1 µm and 5 µm.

Second gallium nitride layer 108 can be highly doped, for example in a range from about $5 \times 10^{17}$ cm$^{-3}$ to about $1 \times 10^{19}$ cm$^{-3}$. Additionally, as with other epitaxial layers, the dopant concentration of second gallium nitride layer 108 can be uniform or non-uniform as a function of thickness. In some embodiments, the dopant concentration increases with thickness, such that the dopant concentration is relatively low near first gallium nitride layer 102 and increases as the distance from first gallium nitride layer 102 increases. Such embodiments provide higher dopant concentrations at the top of second gallium nitride layer 108 where metal contacts can be subsequently formed. Other embodiments utilize heavily doped contact layers (not shown) to form Ohmic contacts.

One method of forming second gallium nitride layer 108, and other layers described herein, can be through a regrowth process that uses an in-situ etch and diffusion preparation processes. These preparation processes are described more fully in U.S. patent application Ser. No. 13/198,666, filed on Aug. 4, 2011, entitled "Method and System for Formation of P-N Junctions in Gallium Nitride Based Electronics," the disclosure of which is hereby incorporated by reference in its entirety. Second gallium nitride layer 108 can be used to form the gate region of vertical power transistor 100.

GaN power transistor 100 may also include an edge termination region. In the embodiment shown in FIG. 1, the edge termination region comprises one or more edge termination structures 104. In one embodiment, edge termination structures 104 are formed by removing at least a portion of second gallium nitride layer 108. The removal can be performed by a controlled etch using an etch mask (not shown but having the dimensions of the edge termination structures 104) designed to stop at approximately the interface between second gallium nitride layer 108 and first gallium nitride layer 102. Inductively-coupled plasma (ICP) etching and/or other common GaN etching processes can be used. In other embodiments, edge termination structures 104 may be formed by implanting ions into portions of second gallium nitride layer 108 to electrically isolate edge termination structures 104. In still other embodiments, the edge termination region may comprise a junction-termination extension (JTE) region, one or more field plates, deep trench termination, and/or a combination of these or other edge termination structures. Additional description related to edge termination regions is provided in U.S. patent application Ser. No. 13/334,742, filed on Dec. 22, 2011, entitled "Method and System For Junction Termination In GaN Materials Using Conductivity Modulation," the disclosure of which is hereby incorporated by reference in its entirety for all purposes.

As illustrated in FIG. 1, second gallium nitride layer/gate region 108 includes a continuous region 114 and one or more finger-like projections 118. Together, the continuous region 114 and projections 118 form the gate region of vertical power transistor 100. A gate electrode 112 is disposed over continuous region 114 and coupled to gate region 108 via gate contacts 120. In some embodiments, gate electrode 112 can include metals such as scandium, nickel, platinum, palladium, silver, gold, copper, aluminum, etc. and alloys thereof. In some embodiments, gate electrode 112 can be a multi-layered structure.

In one embodiment, at least some portions of the gate region may also include a low resistance layer (not shown) that may be disposed on top of the second gallium nitride layer. This low resistance layer may comprise a metal such as scandium, platinum, palladium, nickel, or other suitable materials. The purpose of this layer is to reduce the lateral resistance from gate electrode 112 to various locations on the gate region, which may be advantageous to reduce the distributed gate resistance of vertical power transistor 100 and, thus, improve the switching performance.

First gallium nitride layer 102 can be patterned and etched to form channel regions 106. Channel regions 106 are disposed such that there is one channel region in between two adjacent finger-like gate structures 118. These together form the p-n junction of a diode. Details of the placement of the source and gate structures are described more fully below. In one embodiment, a third gallium nitride layer (not shown) is coupled to first gallium nitride layer 102 and is etched to form channel regions 106. A source electrode 110 is coupled to channel regions 106 via source contacts 116. In some embodiments, source regions are interposed between channel regions 106 and source contacts 116, as described in reference to FIG. 3 below. In some embodiments, source electrode 110 can include metals such as scandium, titanium, aluminum, nickel, gold, copper, etc. and alloys thereof. In some embodiments, source electrode 110 can be a multi-layered structure.

As illustrated in FIG. 1, both source electrode 110 and gate electrode 112 are disposed within the edge termination region. This helps to isolate the low voltage gate and source electrodes from the high voltage of first gallium nitride layer 102. Connections to external systems can be made via electrodes 110 and 112 using wire bonding or other conventional techniques.

Although some embodiments are discussed in terms of a GaN substrate, embodiments of the present invention are not limited to GaN substrates. Other III-V materials, in particular, III-nitride materials, are included within the scope of the present invention and can be substituted not only for the illustrative GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are also included within the scope of the present invention.

The GaN power transistor 100 utilizes an n-type drift layer that is grown on top of an n-type substrate. However, the present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, other n-type dopants may be used, such as Ge, Se, S, O, Te, and the like. In other embodiments, highly or lightly doped material, p-type material, material doped with dopants such as Mg, Ca, Be, and the like can also be used. The substrates discussed herein can include a single material system or multiple material systems including composite structures of multiple layers. One of ordinary skill in the art would recognize many variations, modifications, and alternatives.

Figure 2:
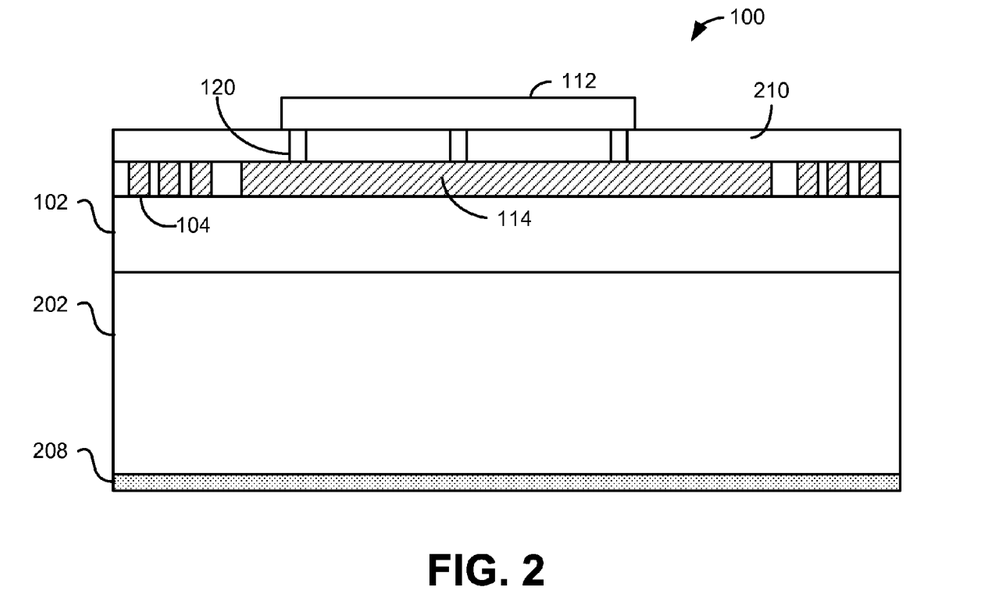
FIG. 2 is a cross-sectional view along the A-A' direction illustrated in FIG. 1.

FIG. 2 illustrates a cross-sectional view of GaN power transistor 100 taken along the A-A' line illustrated in FIG. 1. As described, current flow through the GaN power transistor occurs in a substantially vertical direction (referenced to the horizontal bottom surface of the substrate in the illustrations). Accordingly, embodiments of the present invention can be referred to as vertical GaN transistors or vertical power transistors. As illustrated in FIG. 2, vertical power transistor 100 includes a GaN substrate 202. A first GaN epitaxial layer 102 is coupled to and disposed over a surface of GaN substrate 202. A drain electrode 208 is coupled to an opposing surface of GaN substrate 202. In one embodiment, drain electrode 208 is formed from indium, titanium, aluminum, nickel, gold, or similar materials to provide an Ohmic contact. A second GaN epitaxial layer is disposed over and coupled to first GaN epitaxial layer 102. The second GaN epitaxial layer comprises continuous gate structure 114 and an edge termination region. As discussed above, the edge termination region may comprise multiple edge termination structures. The example of FIGS. 1 and 2 show three edge termination structures 104.

An interlayer dielectric layer (ILD) 210 is disposed over the gate structure 114 and edge termination structures 104. One or more gate contacts 120 are formed in ILD 210 to provide electrical connection between gate structure 114 and gate electrode 112. As can be seen, gate electrode 112 is located such that edge termination structures 104 completely surround gate electrode 112, thereby isolating gate electrode 112 from the high voltage present on the portion of first GaN epitaxial layer 102 that lies outside of the edge termination region.

Figure 3:
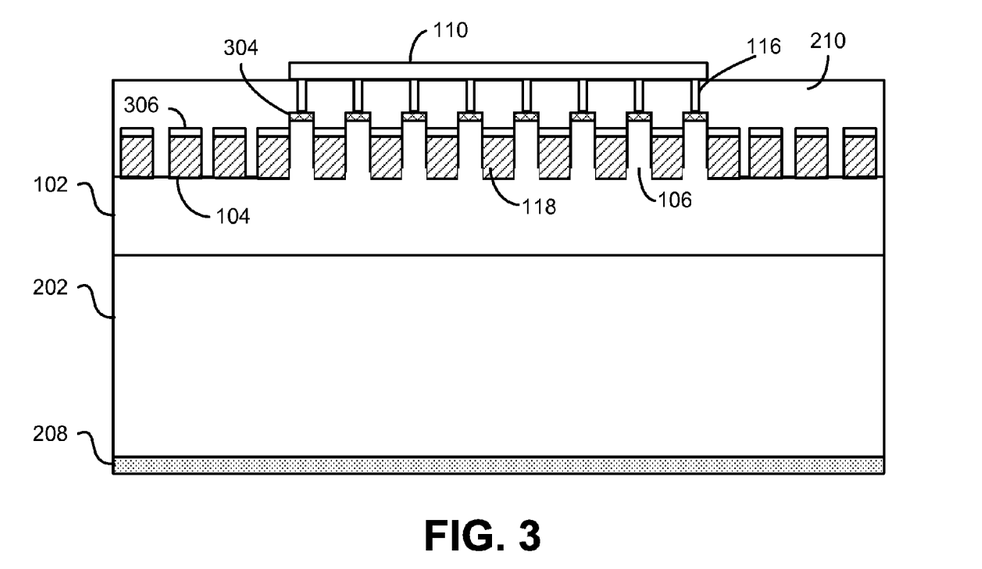
FIG. 3 is a cross-sectional view along the B-B' direction illustrated in FIG. 1.

FIG. 3 illustrates a cross section view of vertical power transistor 100 at the B-B' line illustrated in FIG. 1. As illustrated in FIG. 3, channel regions 106 are disposed between adjacent finger-like projections 118 of gate region 108, creating p-n junctions. In one embodiment, a low resistance layer 306 is disposed on top of the at least some portions of gate region 108 and/or edge structures 104. Low resistance layer 306 may comprise a metal such as platinum, palladium, nickel, or other suitable materials. The purpose of low resistance layer 306 is to reduce the lateral resistance from gate electrode 112 to various locations on the gate region, which may be advantageous to reduce the distributed gate resistance of vertical power transistor 100 and, thus, improve the switching performance.

Source regions 304 are disposed on the top of channel regions 106. Source regions 304 may have the same conductivity type (e.g. N-type) as channel regions 106 and substrate 202. The doping concentration of source regions 304 may be substantially higher than the doping concentration of channel regions 106 in order to form a better Ohmic contact. Source electrode 110 is located such that edge termination structures 104 completely surround source electrode 110, thereby isolating source electrode 110 from the high voltage present on the portion of first GaN epitaxial layer 102 that lies outside of the edge termination region. Source region 304 is electrically coupled to source electrode 110 via source contacts 116. In one embodiment, source regions 304 are electrically isolated from gate region 108. For example, as shown in FIG. 3, the tops of finger-like projections 118 may be recessed below the tops of source regions 304 to provide electrical isolation.

In some embodiments, GaN substrate 202 can have an n+ conductivity type with dopant concentrations ranging from $1 \times 10^{17}$ cm$^{-3}$ to $1 \times 10^{19}$ cm$^{-3}$, and first GaN epitaxial layer 102 can have a n− conductivity type, with dopant concentrations ranging from $1 \times 10^{14}$ cm$^{-3}$ to $1 \times 10^{18}$ cm$^{-3}$. The thickness of first GaN epitaxial layer 102 can be anywhere from 0.5 μm and 100 μm or higher, depending on desired functionality and breakdown voltage. Channel region 106 can have a height of between 0.5 μm and 5 μm, a width of between 0.5 μm and 5 μm, and a n-type conductivity with a dopant concentration that is the same as or lower than the dopant concentration of first GaN epitaxial layer 102. In one embodiment, channel region 106 can be formed by etching away portions of first GaN epitaxial layer 102. Gate region 108 and the edge termination structures 104 can be from 0.1 μm and 5 μm thick and have a p+ conductivity type with dopant concentrations in a range from about $1 \times 10^{17}$ cm$^{-3}$ to about $1 \times 10^{19}$ cm$^{-3}$.

Figure 4:
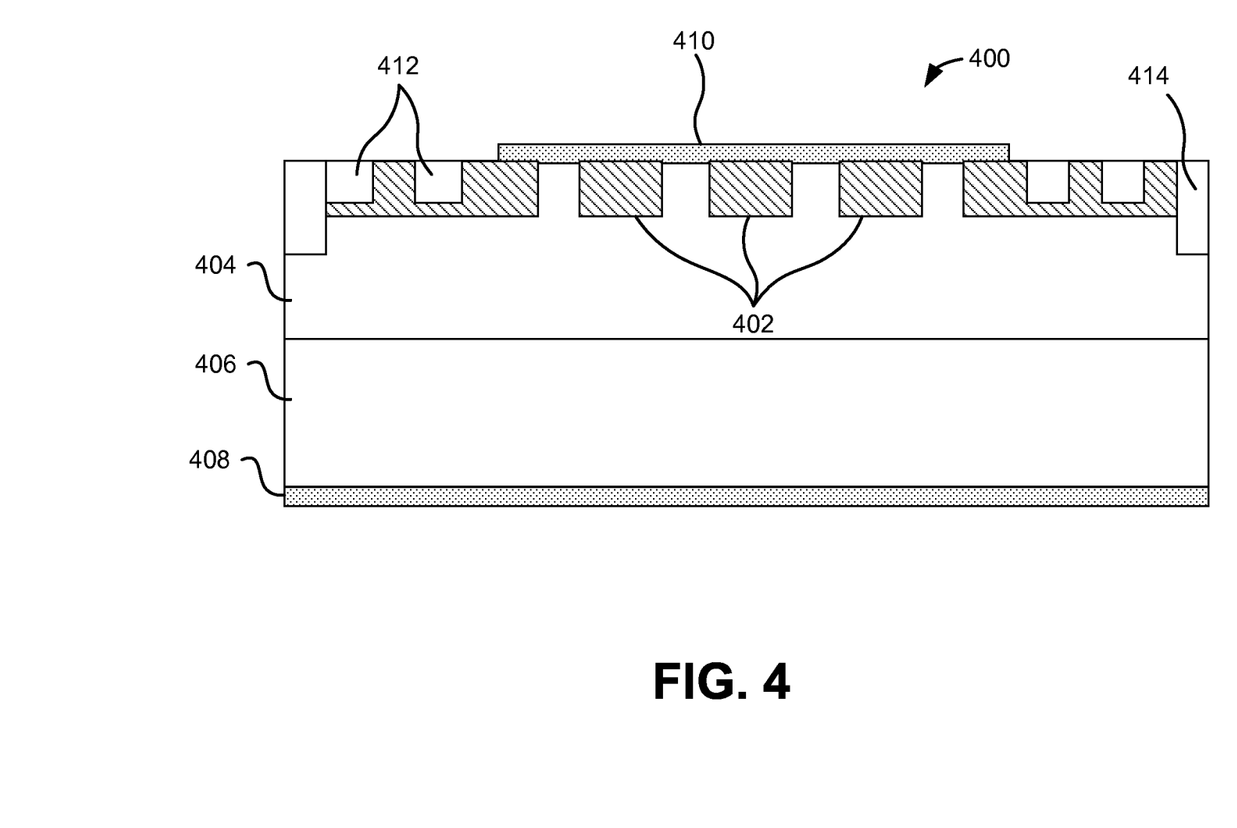
FIG. 4 is a cross-sectional view of a GaN diode according to an embodiment of the present invention.

FIG. 4 illustrates a cross-sectional view of vertical GaN power diode 400 including GaN substrate 406 and first GaN epitaxial layer 404. Similar to the vertical GaN power transistor described above, GaN substrate 406 can have an n+ conductivity type with dopant concentrations ranging from $1 \times 10^{17}$ cm$^{-3}$ to $1 \times 10^{19}$ cm$^{-3}$, and first GaN epitaxial layer 404 can have a n− conductivity type, with dopant concentrations ranging from $1 \times 10^{14}$ cm$^{-3}$ to $1 \times 10^{18}$ cm$^{-3}$. The thickness of first GaN epitaxial layer 404 can be anywhere from 0.5 μm and 100 μm or higher, depending on desired functionality and breakdown voltage. GaN epitaxial regions 402 have a conductivity type opposite the conductivity type of first GaN epitaxial layer 404. For instance, first GaN epitaxial layer 404 is formed from an n-type GaN material and GaN epitaxial regions 402 are formed from a p-type GaN material. In some embodiments, the epitaxial regions 402 are formed using a continuous regrowth over portions of the first GaN epitaxial layer 404 with other portions of the structure, such as regions between the epitaxial regions 402, characterized by reduced or no growth as a result of the presence of a regrowth mask (not shown). One of ordinary skill in the art would recognize many variations, modifications, and alternatives.

The thickness of the epitaxial regions 402 can vary, depending on the process used to form the layer and the device design. In some embodiments, the thickness of the epitaxial regions 450 is between 0.1 μm and 5 μm. In other embodiments, the thickness of the epitaxial regions 450 is between 0.3 μm and 1 μm.

GaN epitaxial regions 402 can be highly doped with a P-type dopant such as magnesium, for example in a range from about $5 \times 10^{17}$ cm$^{-3}$ to about $1 \times 10^{19}$ cm$^{-3}$. The thickness of GaN epitaxial regions 402 can vary, for example, between 0.1 μm and 5 μm. The dopant concentration of GaN epitaxial regions 402 can be uniform or non-uniform as a function of thickness, depending on desired functionality. In some embodiments, for example, the dopant concentration increases with thickness, such that the dopant concentration is relatively low near first GaN epitaxial layer 404 and increases as the distance from the GaN substrate 406 increases. Such embodiments provide higher dopant concentrations at the top of the epitaxial regions 402 where a metal contact can be subsequently formed. Other embodiments utilize heavily doped contact layers (not shown) to form ohmic contacts.

One method of forming the epitaxial regions 450, and other layers described herein, can be through a regrowth process that uses an in-situ etch and diffusion preparation processes.

These preparation processes are described more fully in U.S. patent application Ser. No. 13/198,666, filed on Aug. 4, 2011, the disclosure of which is hereby incorporated by reference in its entirety.

Top metal structure 410 forms an Ohmic electrical contact with at least some of GaN epitaxial regions 402. Top metal structure 410 is also in contact with portions of the first GaN epitaxial layer 404 that extend vertically between GaN epitaxial regions 402. Top metal structure 410 can be one or more layers of metal and/or alloys to create a Schottky barrier with the first GaN epitaxial layer 404. Thus top metal structure 410 forms the anode of a merged PN Schottky (MPS) diode. The cathode of the vertical GaN power diode is formed by bottom metal structure 408, which forms an Ohmic electrical contact with GaN substrate 406.

Some of GaN epitaxial regions 402 are used to provide an edge termination region of MPS diode 400. For example, ion implantation may be used to greatly reduce the conductivity of some areas of some of GaN epitaxial regions 402, as shown by first implanted regions 412, which leave thin conductive portions in some areas of GaN epitaxial regions 402, and by second implanted regions 414, which extend vertically through some areas of GaN epitaxial regions 402 to provide complete electrical isolation.

The MPS diode of FIG. 4 is shown merely by way of example. Many other embodiments of vertical GaN power diodes may be used to facilitate the present invention, including other configurations of MPS diodes, Schottky-barrier diodes, PN diodes, PiN diodes, and the like.

Figure 5A:
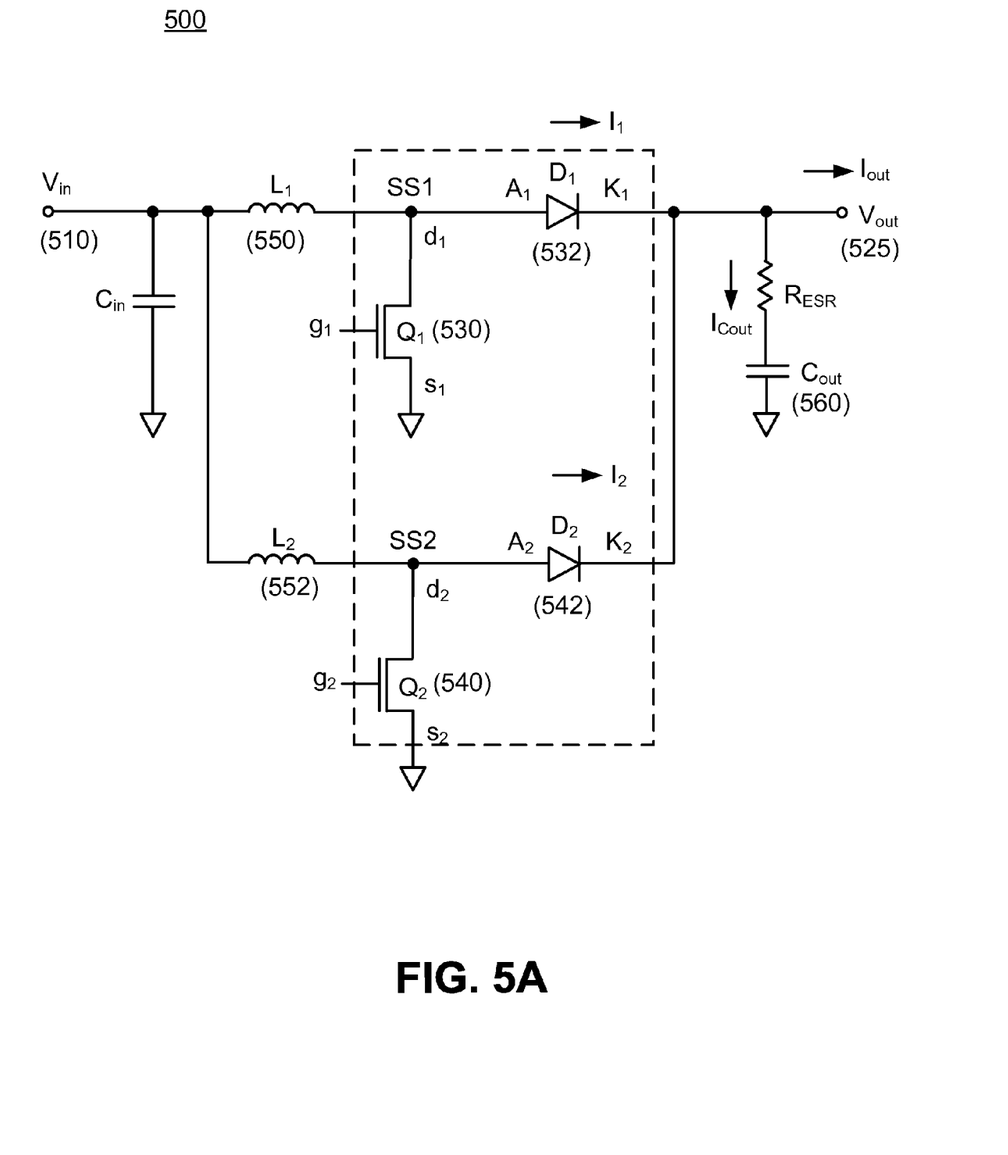
FIG. 5A is a simplified schematic diagram of an interleaved boost mode power factor converter according to an embodiment of the present invention.

FIG. 5A is a simplified schematic diagram of an interleaved boost mode power factor converter (PFC) 500 according to an embodiment of the present invention. Referring to FIG. 5A, the boost mode PFC 500, also referred to as a boost circuit, a boost mode converter, or a boost converter, includes an input voltage source 510, $V_{in}$, which can be connected to a power supply, an inductor 550, a first vertical GaN power transistor $Q_1$ (e.g., first switch) 530, a first vertical GaN power diode $D_1$ 532, a second vertical GaN power transistor $Q_2$ (e.g., second switch) 540, a second vertical GaN power diode $D_2$ 542, and an output voltage $V_{out}$ 525 across output capacitor $C_{out}$ 560. The boost mode PFC effectively boosts a voltage from a lower level (e.g., $V_{in}$) to a higher level (e.g., $V_{out}$). This boosting in voltage may be achieved because of the tendency of the inductors 550 and 552 to resist changes in current. In a boost circuit, the output voltage $V_{out}$ (525) across output capacitor 560 is higher than the input voltage $V_{in}$ (510).

Figure 5B:
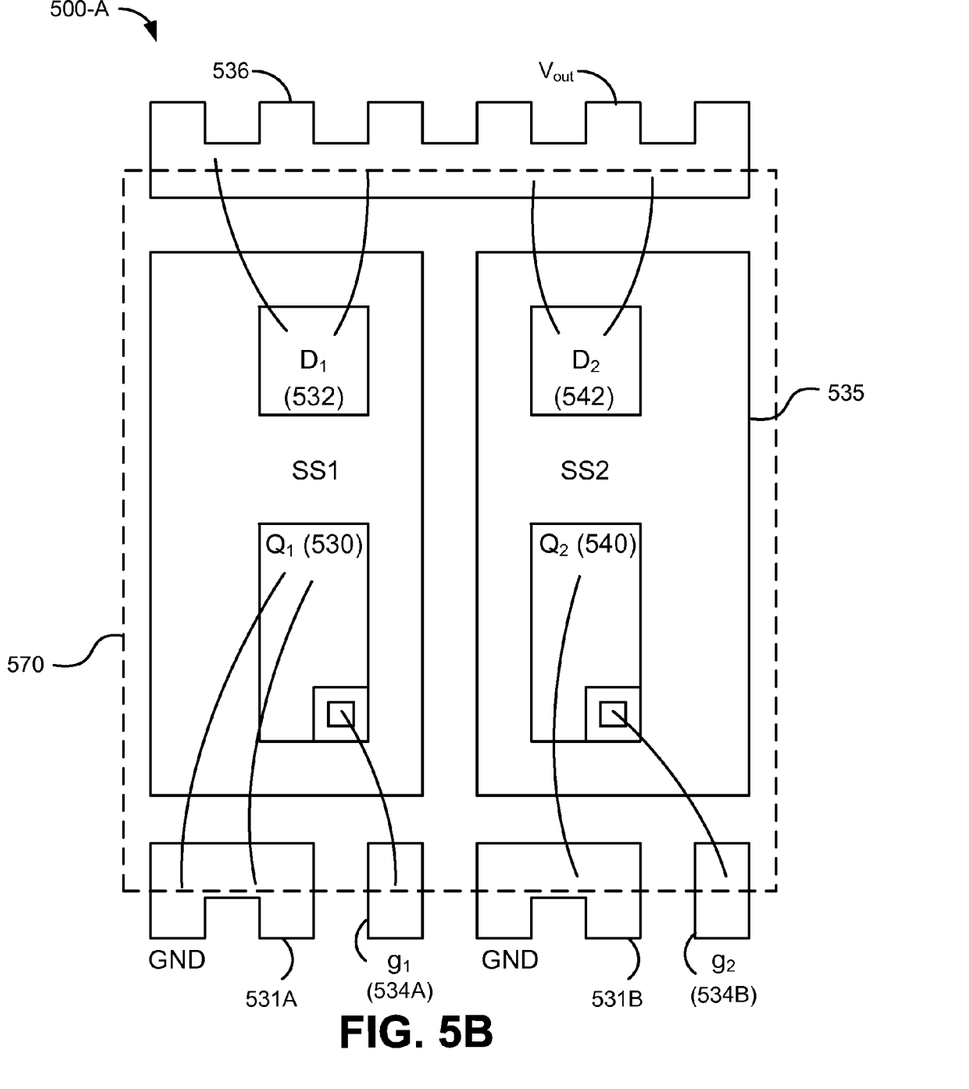
FIG. 5B is a simplified schematic diagram illustrating a semiconductor package including co-packaged vertical GaN power devices according to an embodiment of the present invention.
Figure 5C:
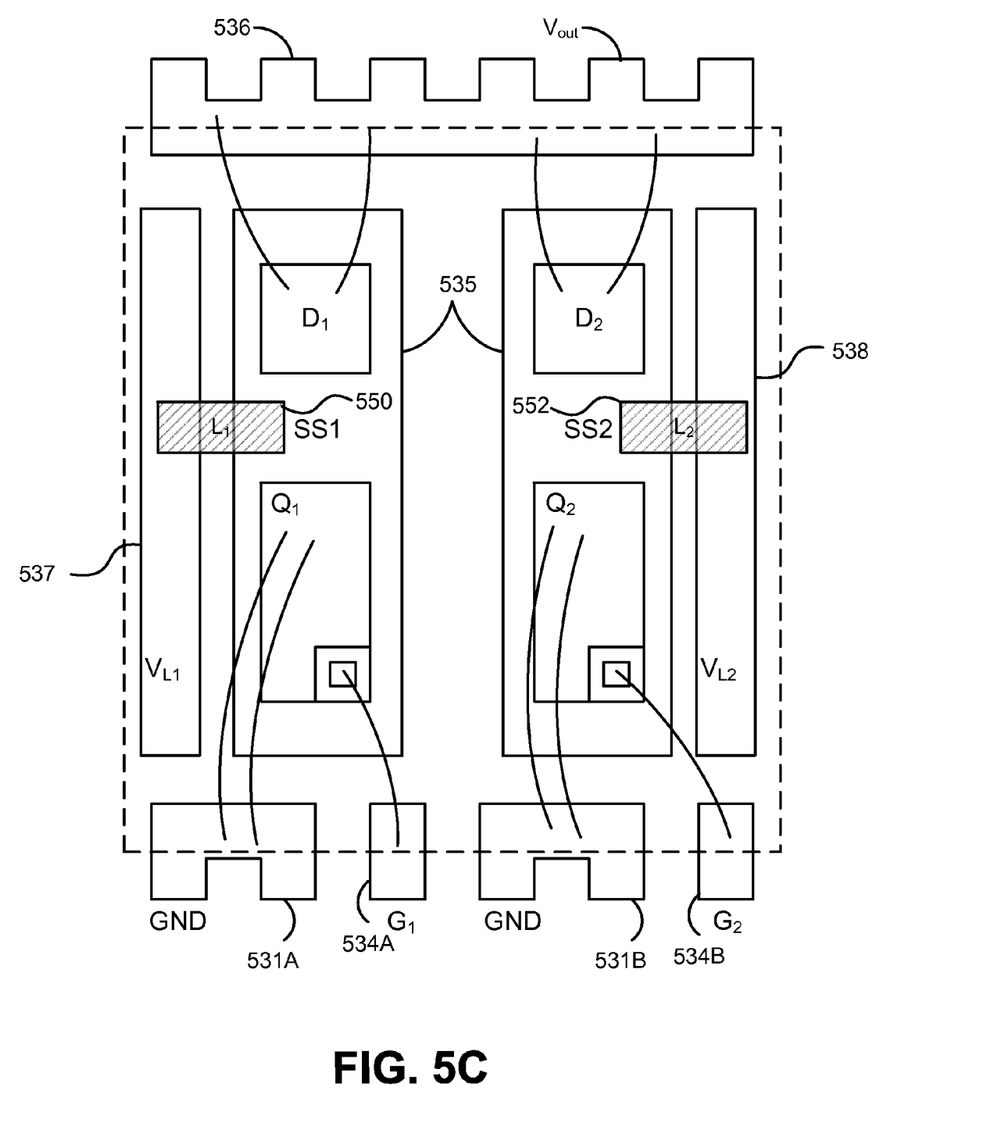
FIG. 5C is a simplified schematic diagram illustrating a semiconductor package including co-packaged vertical GaN power devices according to another embodiment of the present invention.
Figure 5D:
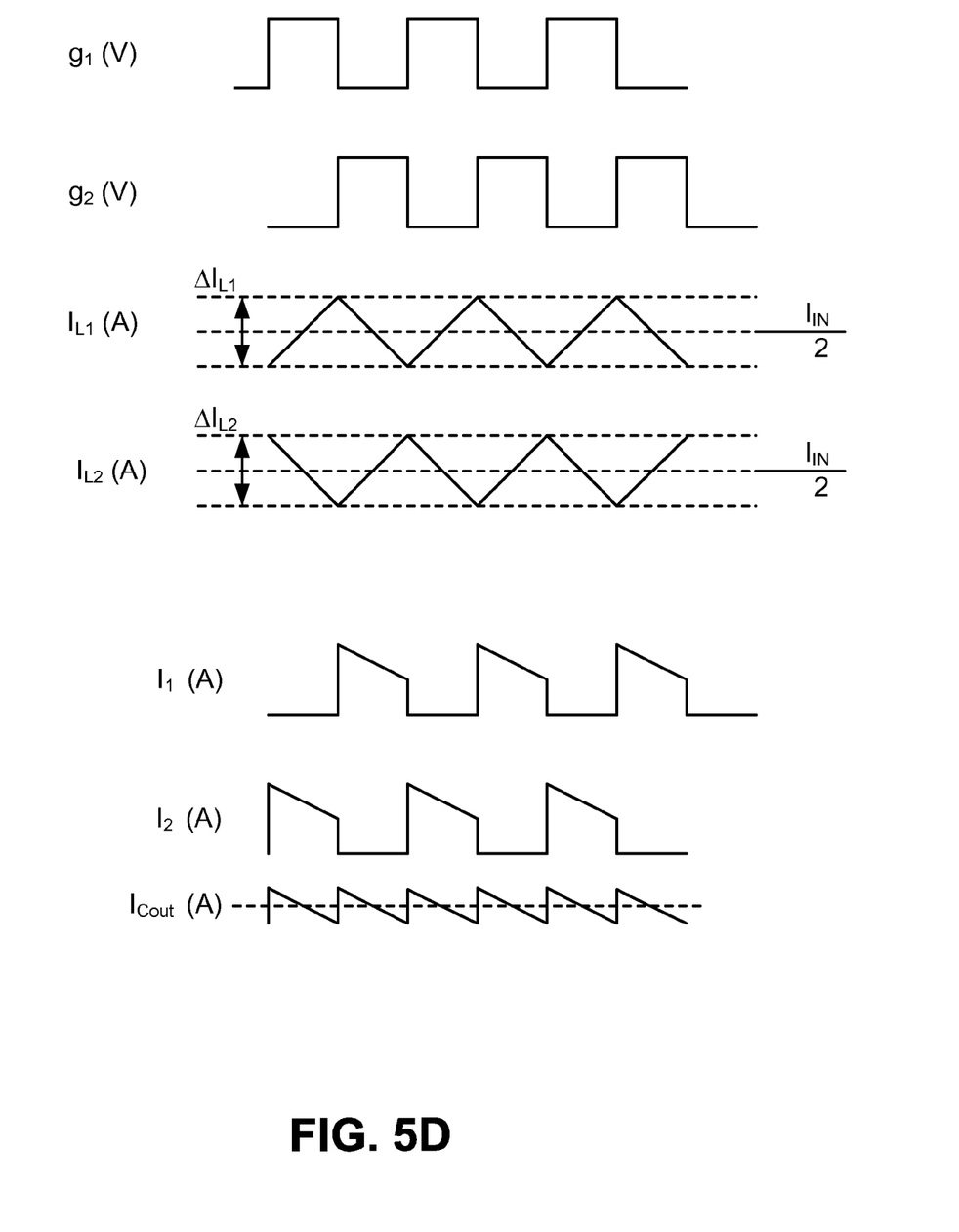
FIG. 5D are simplified timing diagrams illustrating voltages and currents for nodes illustrated in FIG. 5A.

FIG. 5D are simplified timing diagrams illustrating voltages and currents for nodes illustrated in FIG. 5A.

Boost circuits operate by alternating between two states:

(a) On-state: The boost mode PFC 500 operates in an interleaved manner. The circuit is in an On-state when transistor 530 is turned on (i.e., the switch is closed) by the application of a voltage to the gate of transistor 530, illustrated by the positive voltage pulses labeled $g_1$ in FIG. 5D. Accordingly, this results in an increase in the inductor current through inductor 550 ($IL_1$ in FIG. 5D). During interleaved operation, application of a voltage to the gate of transistor 540, illustrated by the positive voltage pulses labeled $g_2$ in FIG. 5D, results in an increase in the inductor current through inductor 552 ($IL_2$ in FIG. 5D). The interleaved example discussed herein operates using a 50% duty cycle, but this is not required by the present invention. In this example, $I_{IN}=I_{L_1}+I_{L_2}$.

When transistor 530 is closed, current flows through the inductor 550 and the inductor 550 stores the energy. When transistor 540 is closed, current flows through the inductor 552 and the inductor 552 stores the energy. Transistors 530 and 540 are turned on by a control circuit (not shown) as a voltage is applied to their respective gates ($g_1$ and $g_2$). During the On-state, induced current flows from the drain nodes ($d_1$ and $d_2$) to the source nodes ($s_1$ and $s_2$) of the transistors Q1 and Q2.

(b) Off-state: When transistor 530/540 is turned off as the voltage applied to the gate $g_1/g_2$ returns to zero, the switch is opened, preventing current flow from the drain node $d_1/d_2$ to the source node $s_1/s_2$. The currents flow through the diodes $D_1/D_2$ from an anode terminal ($A_1/A_2$) to a cathode terminal ($K_1/K_2$), transferring the energy accumulated in inductor 550/552 during the On-state into the capacitor 560. The current in the output capacitor Cout 560 is equal to:

$$I_{Cout}=(I_1+I_2)-I_{out}.$$

Additional description related to boost circuits is provided in U.S. patent application Ser. No. 13/730,619, filed on Dec. 28, 2012, and entitled "Method and System for Co-Packaging Gallium Nitride Electronics," the disclosure of which is hereby incorporated by reference in its entirety for all purposes.

FIG. 5B is a simplified schematic diagram illustrating a semiconductor package including co-packaged vertical GaN power devices according to an embodiment of the present invention. Vertical GaN power transistors 530/540 and vertical GaN power diodes 532/542 are mounted and co-packaged together in the electronic package 500-A illustrated in FIG. 5B, which may be very small, compact, and condensed. GaN power devices are smaller in size than comparable silicon power devices or other semiconductor power devices (for example, 10× to 100× smaller). Because they are co-packaged together, the GaN transistors 530/540 and GaN diodes 532/542 can share a common leadframe 535 and a common ground. The dotted line 570 of the electronic package 500-A illustrated in FIG. 5B illustrates an encapsulating material forming a body of the electronic package, with extensions (e.g., pins) 531A, 531B, 534A, and 534B protruding from the body of the electronic package to be electrically coupled to other connections. Additionally, a set of connected pins 536 are used for the output voltage contacts.

The GaN transistors 530/540 and GaN diodes 532/542 are able to share the same leadframe 535 because the transistors (e.g., the vertical GaN power transistors illustrated in FIGS. 1-3) are mounted with their drains $d_1$ and $d_2$ electrically connected to the leadframe 535 of the electronic package 500-A, while the diodes (e.g., the vertical GaN power diodes illustrated in FIG. 4) are flipped over such that their anode terminals are electrically connected to leadframe 535. Accordingly, as can be seen in the co-package illustrated in boost mode PFC 500, the nodes SS1 and SS2 are shared by the drains $d_1/d_2$ of transistors 530/540 and the anodes of diodes 532/542.

Referring to FIG. 5B, the source $s_1$ of transistor $Q_1$ is wire bonded to pin 531A and the source $s_2$ of transistor $Q_2$ is wire bonded to pin 531B. The gate of transistor $Q_1$ is wire bonded to pin 534A and the gate of transistor $Q_2$ is wire bonded to pin 534B.

The exposed leadframe 535 of package 500-A may be soldered to a heat sink (not shown) to facilitate heat removal from the power devices. Since the GaN transistors and GaN diodes are co-packaged and share the same leadframe, only one heat sink may be soldered to the electronic package, reducing the overall size, weight, and bulk of the electronic package. If the GaN transistor and GaN diode were to be packaged separately, each package would be typically be mounted to a heat sink, adding size and weight to the overall power converter. It should be noted that embodiments of the present invention provide electronic packages that are not suitable for packaging of conventional high power transistor and diode devices due to the comparatively large size of the conventional silicon-based (e.g., silicon carbide) devices since conventional devices cannot be packaged in the small packages discussed herein due to the heat generation and heat loading associated with conventional devices. Additionally, the vertical GaN transistors and vertical GaN diodes discussed herein enable high current densities in small packages (e.g., 5 mm×5 mm, 6 mm×6 mm, and 8 mm×8 mm packages) that are not achievable using conventional devices.

Referring to FIGS. 2-4, drain electrode 208 coupled to GaN substrate 202 acts as the drain regions $d_1/d_2$ of transistors 530/540. Referring to FIG. 4, top metal 410 acts as the anode regions $A_1/A_2$ of diodes 532/542.

High voltage boost circuits induce high currents, e.g., 5-10 A or more, through the diodes and the transistors. Therefore, in one embodiment of the invention, the cathode terminal of the diode ($K_1/K_2$) may be bonded to multiple of the connected pins 536. Likewise, the source terminals of the transistors may be bonded to multiple ground pins 531A and 531B. The common drain/anode connections may conduct large currents directly through the leadframe 535 of the package 500-A.

Although the embodiment illustrated in FIG. 5A includes GaN transistors $Q_1$ and $Q_2$ and diodes $D_1$ and $D_2$ as discrete components, this is not required by the present invention. In other embodiments, the transistor(s) and diode(s) can be integrated as a monolithic device utilizing a single substrate. As an example, one or more GaN vertical transistors can be integrated with one or more diodes in a merged monolithic structure. Additional description related to monolithically integrated GaN transistors and diodes is provided in U.S. patent application Ser. No. 13/289,219, filed on Nov. 4, 2011, and entitled "Monolithically Integrated Vertical JFET and Schottky Diode," the disclosure of which is hereby incorporated by reference in its entirety for all purposes. Thus, in an embodiment, transistor $Q_1$ and diode $D_1$ are monolithically integrated and transistor $Q_2$ and diode $D_2$ are monolithically integrated, facilitating higher performance, reliability, and the like. One of ordinary skill in the art would recognize many variations, modifications, and alternatives.

FIG. 5C is a simplified schematic diagram illustrating a semiconductor package including co-packaged vertical GaN power devices according to another embodiment of the present invention. As illustrated in FIG. 5C, two additional elements 537 and 538 of the leadframe are provided. The inductors 550 and 552 (L1 and L2) are connected at one terminal to the additional elements 537/538 and at the other terminal to the leadframe 535 as discussed in relation to FIG. 5B. Thus, in this design, in addition to integration of transistors and diodes in a single package, inductors are also integrated, reducing footprint and cost and increasing reliability and performance parameters.

Vertical GaN power devices may have one or more top metal electrodes on a top surface, depending on the type of device. The embodiment in FIG. 4, for example includes a single electrode 410 on the top surface of the vertical GaN power MPS diode 400. On the other hand, as shown in FIGS. 1-3, other embodiments of vertical semiconductor devices, such as transistors, can include multiple top metal electrodes 110 and 112, i.e., the gate and source electrodes. The top metal electrodes may be formed from the same top metal layers which are patterned into different areas to form multiple electrodes, and these electrodes can be substantially co-planar or at multiple levels depending on the structure of the device layer(s).

Vertical GaN power devices may also include electrodes comprising metal layers coupled to the GaN substrate. Backside metals (also referred to herein as "back metals") are metals coupled to a bottom surface of a vertical GaN power device. These backside metals can be utilized in the packaging of GaN devices to provide mechanical, electrical, and thermal attachment between the GaN device and its housing or package. This low resistivity connection facilitating vertical current flow is particularly beneficial for vertical power devices. A backside metal can include one or more metal layers. Furthermore, in some embodiments, multiple metal contacts may be formed from a backside metal, depending on device functionality.

Often, the top metal and/or backside metal on semiconductor devices are not solderable. Accordingly, in many cases, devices are attached to a package leadframe with electrically insulating epoxy or electrically conductive (e.g., silver filled) epoxy, which is much less thermally conductive and has a much higher electrical resistivity than solder. Solder, on the other hand, has very good electrical and thermal conductivity. It is also known for good reliability under temperature cycling and environmental testing using high humidity levels at elevated temperatures. Therefore, for power semiconductor devices requiring good electrical and thermal connections, such as vertical power devices, the top metal and/or backside metal of the semiconductor device are preferably attached to the metal leadframe of an electronic package by soldering.

Techniques for providing a solderable back metal are also discussed in U.S. patent application Ser. No. 13/285,271, filed Jul. 19, 2012, entitled "GaN Power Device With Solderable Back Metal," the disclosure of which is hereby incorporated by reference in its entirety for all purposes. These techniques are equally well suited to forming solderable top metal on vertical power devices that are meant to be mounted top-side-down to the leadframe of an electronic package.

Other embodiments of this invention include vertical GaN power devices with top and/or backside metal that is suitable for other means for attaching the GaN power device to a package leadframe. For example, silver sintering is a method of attaching a semiconductor die to a package (i.e., a die-attach method) which may provide suitable electrical and thermal conductivity than solder. A top metal and/or backside metal that includes an outermost layer of gold, silver, or copper may be suitable for use with silver sintering. Another die-attach method that provides excellent electrical and thermal conductivity is eutectic die attach. A top metal and/or backside metal that includes an outermost layer of gold may be suitable for use with eutectic die attach.

In the embodiment of FIGS. 5A-5C, transistors Q1/Q2 may utilize a backside metal (i.e., drain electrodes $d_1/d_2$) that is compatible with soldering, sintering, or eutectic die attach, such that the backside of the transistor die can be mounted to leadframe 535 with good electrical and thermal conductivity. The top metal of the diodes (i.e., anodes $A_1/A_2$) may comprise similar metal layers, such that the top of the diode die can be mounted to leadframe 535 with good electrical and thermal conductivity. Moreover, both transistor die and both diode die may share one or more die attach processes.

In some embodiments of the invention, the top metal and/or backside metal can include a metal stack with various layers to provide a bondable contact surface such that electrically-conducting structures (bonding wires, ribbons, copper clips, tabs, leads, and the like) may be coupled to the top.

In some embodiments of this invention, the top metal and/or or backside metal can comprise a diffusion barrier and/or pad metal. The diffusion barrier, coupled with a protection layer, can help prevent the protection layer from intermixing with other layers placed on top of the diffusion barrier. For example, for a protection layer comprising Au and a pad metal comprising Al, the diffusion barrier can help prevent the protection layer and pad metal from diffusing into each other and forming highly resistive intermetallics, like $Au_5Al_2$ and $AuAl_2$. Furthermore, depending on the composition of the protection layer and pad metal, the diffusion barrier can also act as an adhesion layer. Acceptable materials for the diffusion barrier can include Ni, Pt, Mo, W, TiW, titanium nitride (TiN) and/or Cr. In one embodiment, the diffusion barrier includes a bottom layer of Ti, which adheres well to both protection layer and dielectric layer, and an upper layer of Ni, Pt, W, TiW, or similar diffusion barrier layers. The thickness of the diffusion barrier can vary, depending on processing concerns (e.g., coverage), as well as other factors. In some embodiments, for example, the thickness of the diffusion barrier can be between 25 nm and 400 nm thick.

The pad metal provides a bondable surface to which wire (and/or other types) of bonds may be formed. Thick aluminum (Al) wires bonds are commonly used, for example, to form contacts in power electronics. Larger diameter (e.g. 50 μm-500 μm) Al wires provide a high current and low resistance path to the semiconductor device. In some embodiments, the pad metal can comprise Al, which is easily deposited, inexpensive, and readily bondable to Al bond wires. Additionally or alternatively, other materials, such as Cu, can be used. Furthermore, physical features and/or patterns of the pad metal and/or the diffusion barrier can be defined by material removal processes, such as a lithographical wet etch.

The thickness of the pad metal can vary, depending on composition, desired functionality, and/or other factors. The pad metal can be relatively thick to help ensure the structural integrity of the pad metal can withstand a subsequent wire bonding process. In particular, the Al wire bonding process exerts large forces on the pad metal. A thick pad metal can absorb these forces to prevent damage to the underlying GaN device layers. In some embodiments, for example, the thickness of the pad metal can be between 2 μm and 6 μm. In one embodiment, thickness is in the range of 3.5 μm to 4.5 μm.

Transistors $Q_1$ and $Q_2$ and may utilize a topside metal (i.e., source electrodes $s_1$ and $s_2$) that are compatible with wire bonding, ribbon bonding, copper clips, and/or other contact methods to make contact with pins 531A and 531B, respectively. The backside metal of diodes $D_1$ and $D_2$ may comprise similar metal layers, such that when these devices are mounted topside down, the upward facing backside metal is compatible with the same topside contact methods to make contact with pin 536. Moreover, the transistor die and diode die may share one or more die top-side contact processes. For example, copper clips may be attached to the upward facing surfaces of both die during the same processing step.

Techniques for providing a bondable contact metal may be used in conjunction with techniques for providing a solderable contact metal. These techniques for providing a solderable contact metal are also discussed in and U.S. patent application Ser. No. 13/611,467, filed Sep. 12, 2012, entitled "Bondable Top Metal Contact for Gallium Nitride Power Devices," the disclosure of which is hereby incorporated by reference in its entirety for all purposes.

It should also be noted that the overmold packages described herein utilize mounting configurations not utilized in conventional designs. Referring to FIGS. 5A and 5B, GaN diodes $D_1$ and $D_2$ are mounted on the leadframe with the substrate facing up. In conventional designs, since separate packages are utilized for each of the transistors and diodes, there is no benefit provided by mounting the transistors or diodes in the atypical substrate-up configuration. However, in the embodiments described herein, in order to provide the illustrated connections to the lead frame, flipping of the appropriate devices substrate-up prior to mounting provides benefits not achievable using conventional techniques.

Co-packaging the GaN transistors and the GaN diodes also reduces additional parasitic effects that result from separately packaging the devices and using interconnections between both packages. The longer and thinner the interconnections are between separate packages, the more inductance and resistance is introduced. Mounting the separate packages further apart on a circuit board magnifies the problems, resulting in ringing as these inductances are switching at high currents and high voltages and transitioning quickly, which also causes EMI problems. Increased EMI generates high frequency radiation which may negatively affect other devices mounted on the same circuit board as the GaN transistors and GaN diodes package.

Illustratively, the resulting package of co-packaging GaN transistors with GaN diodes may be much smaller than conventional silicon packages using conventional techniques. For example, two 600V/5 A GaN transistors and two 600V/5 A GaN diodes may be co-packaged in a 5 mm×5 mm package, while a conventional TO220 package for a 600V/5 A silicon transistor and a separate package for a 600V/5 A silicon diode measures approximately 10 mm×15 mm each. As such, the electronic package for a GaN electronic circuit may be 10 to 100 times smaller than a package for the corresponding silicon electronic circuit. In conventional TO220 packages, tabs may be at different voltages, therefore attached to separate heat sinks, which makes conventional TO220 packages of silicon devices and circuits even larger.

Furthermore, dual flat no-lead packages that can be utilized with the co-packaged GaN transistors and GaN diodes described herein may cost far less than traditional TO220 packages (e.g., 25-75% of the cost per package). The reduced size and bulk of co-packaged GaN devices results in reduced circuit board space, also lowering the cost assembly and manufacture of circuit boards and its enclosures. Additionally, since embodiments can utilize only one leadframe and one heat sink, materials and manufacturing costs are reduced further. For at least these reasons, methods and systems for manufacturing and fabricating GaN packages are more cost-effective and efficient than conventional methods and systems.

Referring once again to FIG. 5B, the electronic package 500-A includes a leadframe 535 and a plurality of pins. The two GaN transistors and two GaN diodes are mounted on the leadframe 535. Turning to each of the GaN transistors and GaN diodes, the GaN transistors include a drain region, a drift region, a source region, and a gate region. The drain region comprises a GaN substrate and a drain contact, the drift region comprises a first GaN epitaxial layer coupled to the GaN substrate, the source region is separated from the GaN substrate by the drift region and comprises a source contact, and the gate region comprises a second GaN epitaxial layer coupled to the first GaN epitaxial layer and a gate contact. The GaN diodes each include an anode region and a cathode region. The cathode region comprises the GaN substrate and a cathode contact and the anode region comprises a third GaN epitaxial layer coupled to the GaN substrate and an anode contact. The drain contact of first GaN transistor $Q_1$, the drain contact of second GaN transistor $Q_2$, the anode contact of first GaN diode $D_1$, and the anode contact of second GaN diode $D_2$ are electrically connected to the leadframe 535.

Figure 6:
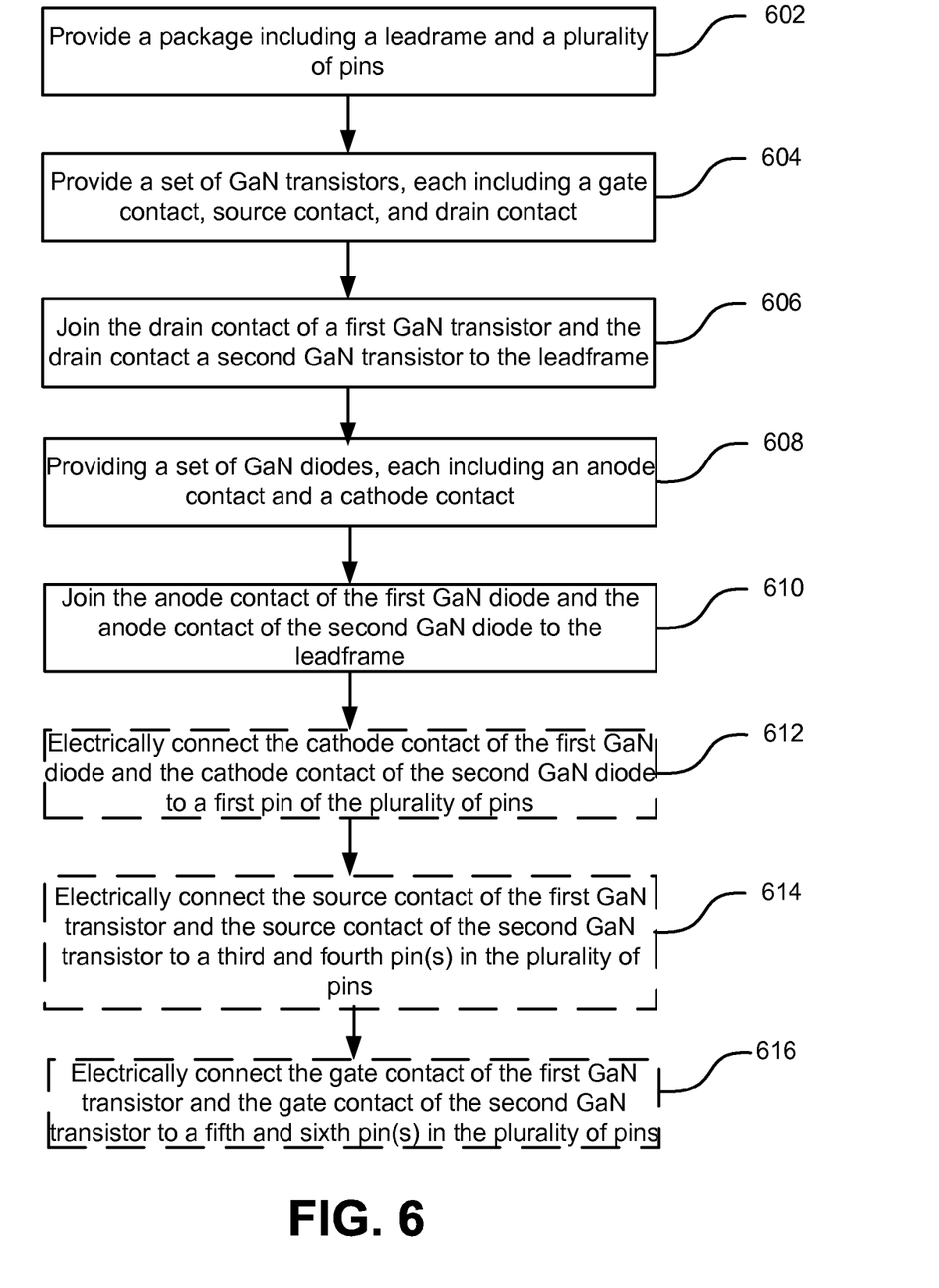
FIG. 6 is a simplified flowchart illustrating a method of fabricating a co-packaged GaN electronic device according to an embodiment of the present invention.

FIG. 6 is a simplified flowchart illustrating a method of fabricating a GaN-based electronics package where a set of vertical GaN transistors are co-packaged with a set of GaN diodes according to an embodiment of the present invention. The method includes providing a package including a leadframe and a plurality of pins (602). Next, a set of GaN transistors is provided (604). In an embodiment, two GaN transistors are provided for co-packaging as described herein. Each of the GaN transistors may include a drain region, a drift region, a source region, and a gate region. In some embodiments, the drain region may comprise a GaN substrate and a drain contact. The source region may comprise a first GaN layer coupled to the GaN substrate and a source contact. The gate region may comprise a second GaN layer coupled to the GaN substrate and a gate contact. The method further includes joining the drain contact of a first GaN transistor of the set of GaN transistors and the drain contact of a second GaN transistor of the set of GaN transistors to the leadframe (606).

In an embodiment, the GaN substrate is a n-type gallium nitride substrate, and the drift region may be a first GaN epitaxial layer coupled to a front surface of the GaN substrate. The first GaN epitaxial layer is characterized by a first dopant concentration, for example n-type doping with dopant concentrations ranging from $1\times10^{14}$ cm$^{-3}$ to $1\times10^{18}$ cm$^{-3}$. The thickness of the first GaN epitaxial layer may vary, depending on the process used to form the layer and the device design. For example, using homoepitaxy techniques, the thickness of the first GaN epitaxial layer may be between 1 µm and 100 µm. The gate region may be a second GaN epitaxial layer of an opposite type from the first GaN epitaxial layer coupled to the first GaN epitaxial later. The dopant concentration of the second GaN epitaxial layer may exceed the dopant concentrations of the first GaN epitaxial layer. For example, a p-type dopant concentration of the second GaN epitaxial layer can be equal to or greater than $1\times10^{18}$ cm$^{-3}$. The thickness of the second GaN epitaxial layer may vary, depending on the process used to form the layer and the device design. In some embodiments, the thickness of the second GaN epitaxial layer may be between 0.1 µm and 5 µm.

The method further includes providing a set of GaN diodes (e.g. two GaN diodes), each including an anode region and a cathode region (608). The cathode region may comprise the GaN substrate and a cathode contact. The anode region may comprise a GaN epitaxial layer coupled to the GaN substrate and an anode contact. The method includes joining the anode contact of the first GaN diode and the anode contact of the second GaN diode to the leadframe (610), which is also joined with the drain contact of the first GaN transistor and the drain contact of the second GaN transistor.

The GaN epitaxial layer of the GaN diodes may be coupled to the front surface of the GaN substrates, and may have similar properties to those of the first GaN epitaxial layers of the GaN transistors.

In an optional embodiment, the method further includes electrically connecting the cathode contact of the first GaN diode and the cathode contact of the second GaN diode to a first pin in the plurality of pins of the leadframe (612). In an embodiment of the invention, to accommodate high currents, the cathode contact of the first GaN diode and the cathode contact of the second GaN diode may be electrically connected to one or more additional pins. The source contact of the first GaN transistor and the source contact of the second GaN transistor are electrically connected to third and fourth pin in the plurality of pins, respectively (614), and the gate contacts are electrically connected to fifth and sixth pins in the plurality of pins, respectively (616)

It should be appreciated that the specific steps illustrated in FIG. 6 provide a particular method of fabricating a vertical power device according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple substeps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electronic package comprising:
    a leadframe;
    a plurality of pins;
    a first gallium nitride (GaN) transistor comprising a source, gate, and drain, wherein the drain of the first GaN transistor is electrically connected to the leadframe;
    a second GaN transistor comprising a source, gate, and drain, wherein the drain of the second GaN transistor is electrically connected to the leadframe;
    a first GaN diode comprising an anode and cathode, wherein the anode of the first GaN diode is electrically connected to the leadframe and the cathode of the first GaN diode is wire bonded to an output pin of the plurality of pins; and
    a second GaN diode comprising an anode and cathode, wherein the anode of the second GaN diode is electrically connected to the leadframe and the cathode of the second GaN diode is wire bonded to the output pin of the plurality of pins.

2. The electronic package of claim 1 wherein:
    the source of the first GaN transistor is electrically connected to a first pin of the plurality of pins;
    the gate of the first GaN transistor is electrically connected to a second pin of the plurality of pins;
    the source of the second GaN transistor is electrically connected to a third pin of the plurality of pins; and
    the gate of the second GaN transistor is electrically connected to a fourth pin of the plurality of pins.

3. The electronic package of claim 2 wherein the first pin and the third pin are ground pins.

4. The electronic package of claim 2 wherein the electrical connections of the drain of the first GaN transistor and the source and gate of the second GaN transistor comprise at least one of wire bonds, ribbon bonds, or copper clips.

5. The electronic package of claim 1 wherein:
    the electrical connection between the anode of the first diode and the leadframe comprises at least one of epoxy, eutectic, sintering, or solder; and
    the electrical connection between the anode of the second diode and the leadframe comprises at least one of epoxy, eutectic, sintering, or solder.

6. The electronic package of claim 1 wherein:
    the electrical connection between the drain of the second GaN transistor and the leadframe comprises at least one of epoxy, eutectic, sintering, or solder; and
    the electrical connection between the drain of the first GaN transistor and the leadframe comprises at least one of epoxy, eutectic, sintering, or solder.

7. The electronic package of claim 1 wherein the gallium nitride-based electronics package is electrically coupled and attached to a circuit board, wherein the leadframe is configured to conduct current from the drain of the first GaN transistor, the drain of the second GaN transistor, the anode of the first GaN diode, and the anode of the second GaN diode directly to the circuit board.

8. The electronic package of claim 1 further comprising one or more heat sinks attached to the leadframe.

9. The electronic package of claim 1 wherein the drain of the first GaN transistor and the drain of the second GaN transistor comprise a solderable metal stack.

10. The electronic package of claim 1 wherein the source of the first GaN transistor and the source of the second GaN transistor comprise a bondable metal stack.

* * * * *